United States Patent [19]
Drowley et al.

[11] Patent Number: 5,312,764
[45] Date of Patent: May 17, 1994

[54] METHOD OF DOPING A SEMICONDUCTOR SUBSTRATE

[75] Inventors: Clifford I. Drowley; James A. Teplik, Mesa; Erik W. Egan, Phoenix, all of Ariz.

[73] Assignee: Motorola, Inc., Schaumburg, Ill.

[21] Appl. No.: 68,339

[22] Filed: May 28, 1993

[51] Int. Cl.$^5$ .......................................... H01L 21/265
[52] U.S. Cl. ...................................... 437/20; 437/25; 437/26; 437/29; 437/97; 437/141; 437/248; 437/952; 148/DIG. 24; 148/DIG. 3
[58] Field of Search ........................ 437/20, 25, 26, 97, 437/141, 939, 949, 952, 985, 29, 248, 174; 148/DIG. 22, DIG. 23, DIG. 24, DIG. 3

[56] References Cited
U.S. PATENT DOCUMENTS

| | | | |
|---|---|---|---|
| 4,153,486 | 5/1979 | Srinivasan | 437/97 |
| 4,717,588 | 1/1988 | Wilson et al. | 437/25 |
| 4,717,687 | 1/1988 | Verma | |
| 4,784,964 | 11/1988 | Hulseweh et al. | |
| 4,931,405 | 6/1990 | Kamijo et al. | 437/29 |
| 4,975,126 | 12/1990 | Margail et al. | 437/26 |
| 5,070,029 | 12/1991 | Pfiester et al. | 437/29 |
| 5,139,961 | 8/1992 | Solheim et al. | |
| 5,151,381 | 9/1992 | Liu et al. | 437/29 |
| 5,182,226 | 1/1993 | Jang | 437/26 |
| 5,210,056 | 5/1993 | Pong et al. | 437/248 |

OTHER PUBLICATIONS

D. Hagmann et al., "A Method to Impede the Formation of Crystal Defects after High Dose Arsenic Implants," J. Electrochem. Soc.: Solid-State Science and Technology, Dec. 1986, pp. 2597-2600.

D. Hagmann, "Understanding and Control of Residual Defects Generated by Implanted High Dose As+ Bipolard Subcollectors," Electrochem. Society Proceedings, vol. 83-9, 1983, pp. 578-588.

Primary Examiner—Olik Chaudhuri
Assistant Examiner—Ramamohan Rao Paladugu
Attorney, Agent, or Firm—Rennie W. Dover; Joe E. Barbee

[57] ABSTRACT

A method of decoupling a step for modulating a defect density from a step for modulating a junction depth. A semiconductor substrate (30) having a portion doped with a dopant (34) is heated to a pre-oxidation anneal temperature in a pre-oxidation anneal step (23). After the pre-oxidation anneal step (23), the semiconductor substrate (30) undergoes an oxidation step (25) which serves as a step for modulating the defect density. Subsequent to the oxidation step (25), the semiconductor substrate (30) undergoes a drive-in step (27) which serves as a step for modulating the junction depth. Then, the temperature of the semiconductor substrate (30) is lowered to allow further processing of the semiconductor substrate (30).

19 Claims, 2 Drawing Sheets

METHOD OF DOPING A SEMICONDUCTOR SUBSTRATE

BACKGROUND OF THE INVENTION

This invention relates, in general, to methods of manufacturing semiconductor integrated circuits, and more particularly, to methods of manufacturing semiconductor integrated circuits having a defect density reduction step decoupled from a step for setting a junction depth.

The manufacture of semiconductor integrated circuits includes such steps as formation of a buried layer on a semiconductor substrate, growth of an epitaxial layer over the semiconductor substrate, providing base, emitter, and collector regions in the epitaxial layer to form bipolar transistors, and providing drain, gate, and source regions in the epitaxial layer to form field effect transistors. In bipolar semiconductor integrated circuits, the buried layer reduces the collector resistance and is commonly referred to as a subcollector layer. In field effect transistors (FET's) the buried layer suppress latch-up.

Typically, the buried layer is formed by heavily doping a portion of the semiconductor substrate, oxidizing a surface of the substrate, annealing the substrate, and removing the oxide layer. Subsequently an epitaxial layer is grown over the semiconductor substrate. One method of doping the semiconductor substrate is via ion implantation. A common problem associated with buried layer formation using ion implantation is that the ion implantation process damages the semiconductor substrate. Such damage to the semiconductor substrate can propagate upward during the epitaxial growth, thereby creating defects on the surface of the epitaxial layer. One approach to decreasing the number of defects has been to oxidize the semiconductor substrate after it has been doped, but before the formation of the epitaxial layer, followed by a high temperature anneal. This technique consumes the damaged silicon region by converting it into an oxide layer which is then stripped from the semiconductor substrate. Thus, oxidation of the semiconductor substrate reduces the number of implant-created defect sites prior to epitaxial growth.

An additional benefit of the oxidation technique is that under appropriate oxidation conditions, the oxidation rate of the heavily doped regions is greater than that of adjacent lightly doped regions. The oxide formed by the differential oxidation provides a step in the silicon surface which is self-aligned to the buried layer and which may be used for alignment of subsequent masking layers. Further, the resulting differential oxide serves as a blocking mask during formation of buried layers for adjacent complementary type semiconductor devices.

A drawback of this oxidation technique is that an epitaxial layer grown over the substrate still has a significant defect density. A high temperature anneal is used to decrease the defect density. To further minimize defects, the anneal must be done at very high temperatures, resulting in buried layers that are both deep and wide. Thus, reduction in the epitaxial layer defect density and junction depth are coupled.

To minimize the junction depth, severe temperature ramp rates are often used which makes the process more susceptible to further defects associated with slip. Because of this junction depth constraint, the high temperature anneal is unable to eliminate all of the defects. As wafer sizes increase the susceptiblity to slip also increases.

Accordingly, it would be advantageous to have a method of forming a buried layer that separates epitaxial layer defect density control from the junction depth control. The technique should decrease the sheet resistance at the semiconductor substrate surface and decrease lateral spreading of the buried layer dopants. It would be of further advantage for the method to reduce overall defect density and susceptibility to slip. Such a method should maintain the advantages of the original process, e.g., those associated with differential oxidation, and be compatible with standard, large diameter wafer processing equipment.

SUMMARY OF THE INVENTION

Briefly stated, the present invention is a method of doping a semiconductor substrate that is capable of reducing a defect density and setting a junction depth. In the method a semiconductor impurity material of a first conductivity type is provided to the semiconductor substrate and the semiconductor substrate is subsequently heated to a temperature of at least 950° C. Then, the semiconductor substrate is oxidized at a temperature of less than 900° C. After the oxidation step, the semiconductor substrate is heated to a temperature ranging between 950° C. and 1200° C. followed by reducing the temperature of the semiconductor substrate to a temperature ranging between 600° C. and 900° C.

DETAILED DESCRIPTION OF THE DRAWINGS

Figure 1:
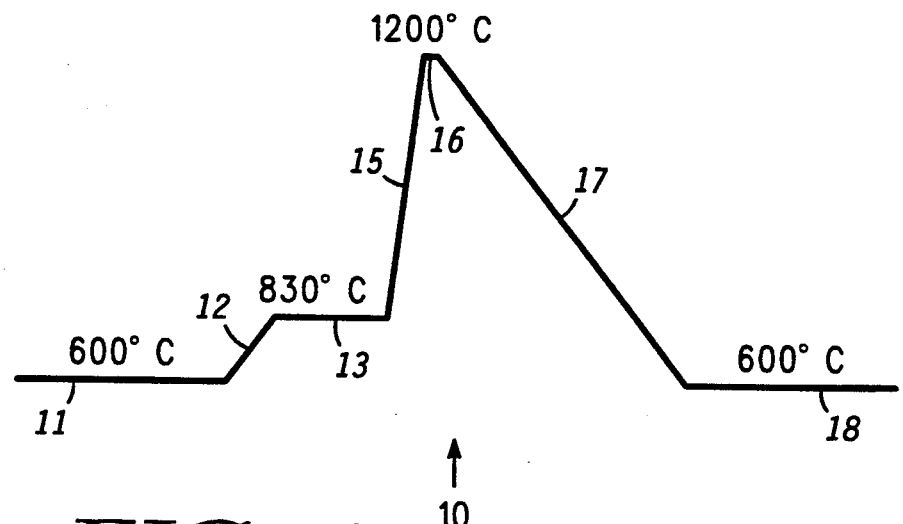
FIG. 1 is a highly simplified chart illustrating times and temperatures of a prior art method of oxidizing and annealing a semiconductor substrate having a highly doped region.

FIG. 1 is a highly simplified chart illustrating times and temperatures of a prior art method of oxidizing and annealing a semiconductor substrate having a highly doped region on its surface. In the prior art method of FIG. 1, a silicon semiconductor substrate having a <100> crystal orientation, doped with a dopant of P conductivity type, and having a resistivity ranging between 3 and 25 ohms-centimeter is provided. The highly doped region is formed by implanting a dopant of N conductivity type with $8 \times 10^{15}$ ions per square centimeter (ions/cm$^2$). The semiconductor substrate is pushed into a furnace, stabilized, and annealed at a temperature of approximately 600° C. for approximately two hours (reference numeral 11).

The temperature of the furnace is then increased to 830° C. at a rate of approximately 7° C. per minute (reference numeral 12). Increasing the furnace temperature is commonly referred to as ramping up the temperature. It shall be understood that ramping up the furnace to a desired temperature is tantamount to ramping up or heating the semiconductor substrate to the desired temperature since the semiconductor substrate is inside of the furnace. After the semiconductor substrate reaches 830° C., it is stabilized or equilibrated at that temperature for approximately 5 minutes. Then the semiconductor substrate is oxidized at said temperature for approximately 54 minutes (reference numeral 13). Steam is used to grow oxide at the desired temperature.

After growing the oxide with the steam, the temperature of the furnace is elevated to a desired drive-in or anneal temperature at a rate of approximately 18° C. per minute (reference numeral 15). A desirable drive-in temperature is approximately 1200° C., thus said drive-in temperature is attained in about 20.6 minutes where it is maintained for approximately 5 minutes (reference numeral 16). Subsequently, the furnace temperature is decreased to 600° C. at a rate of approximately 3° C. per minute (reference numeral 17). Thus, the furnace temperature, and hence the temperature of the semiconductor substrate, is lowered from the drive-in temperature to approximately 600° C. in about 200 minutes. Lowering the furnace temperature is commonly referred to as ramping down the temperature. It shall be understood that ramping down the furnace to a desired temperature is equivalent to ramping down or reducing the temperature of the semiconductor substrate since the semiconductor substrate is inside of the furnace. Once the temperature is at approximately 600° C. (reference numeral 18), the semiconductor substrate may be safely removed from the furnace.

Figure 2:
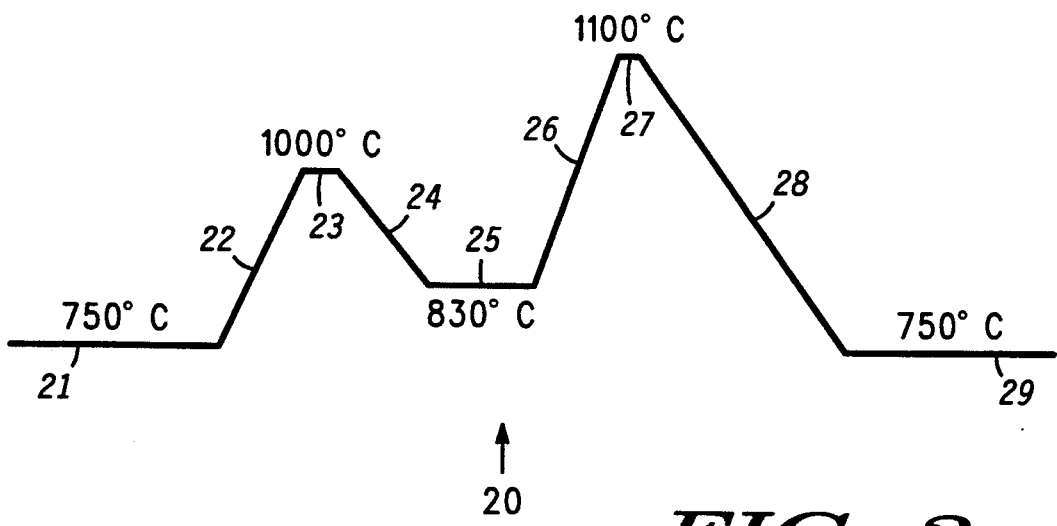
FIG. 2 is a highly simplified chart illustrating times and temperatures used in performing the present invention.

FIG. 2 is a highly simplified chart 20 illustrating the times and temperatures for annealing, oxidizing, and driving dopants into a semiconductor substrate in accordance with the present invention. Thus, chart 20 graphically illustrates a method of doping a semiconductor substrate capable of reducing a defect density and independently setting a junction depth. Preferably, the semiconductor substrate is a silicon wafer of P conductivity type having a <100> crystal orientation and a resistivity ranging from approximately 3 to approximately 25 ohms-centimeter. A highly doped region is formed on the surface of the semiconductor substrate by implanting, for example, arsenic at a dose ranging between approximately $3 \times 10^{15}$ ions/cm$^2$ and approximately $2 \times 10^{16}$ ions/cm$^2$ and an implant energy of approximately 60,000 electron volts. Although, the description is in terms of using ion implantation to form the heavily doped region, it shall be understood that this is not a limitation of the present invention. In other words, the dopants or impurity material may be introduced using standard diffusion techniques. Further, it shall be understood that the impurity material may be any suitable semiconductor dopant such as antimony, phosphorus, boron, or the like. Preferably, the dopant is selected such that the semiconductor substrate is differentially oxidized. Methods of forming highly doped regions on a semiconductor substrate such as, for example, a buried layer region, are well known to those skilled in the art.

In a first step, a semiconductor substrate having the highly doped region is placed in a furnace (reference numeral 21). The temperature of the furnace may range between approximately 600° C. and approximately 900° C. In a preferred embodiment, the furnace is set at a temperature of approximately 750° C. The semiconductor substrate is equilibrated at this temperature for approximately 15 minutes. Then the furnace is ramped up to a pre-oxidation anneal temperature of at least approximately 950° C. and at most approximately 1100° C. at a ramp-up rate of less than or equal to approximately 5° C. per minute (reference numeral 22). In the preferred embodiment, the furnace is ramped up from approximately 750° C. to a pre-oxidation anneal temperature of approximately 1000° C. in about 50 minutes. The semiconductor substrate is maintained at the pre-oxidation anneal temperature for at least 10 minutes and preferably about 15 minutes (reference numeral 23). This step is also referred to as a pre-oxidation anneal. Heating or maintaining the semiconductor substrate at the pre-oxidation anneal temperature of at least 950° C. serves as a defect density reduction step, i.e., a step for decreasing a defect density. The defect density reduction step is also referred to as a defect density modulation step.

Upon completion of the pre-oxidation anneal step, the furnace is ramped down (reference numeral 24) to a temperature less than approximately 900° C. and preferably between 825° C. and 900° C. In the preferred embodiment, the furnace is ramped down to approximately 830° C. and stabilized at this temperature for about 5 minutes. The temperature is ramped down at a rate of less than or equal to approximately 3° C. per minute. Preferably, the temperature ramp-down to approximately 830° C. takes about 57 minutes.

A wet oxidation (reference numeral 25) is performed wherein steam is used to grow an oxide. In other words, the oxidizing ambient atmosphere is formed using steam. In one example, approximately 450 nanometers of oxide is grown over the buried layer. The formation of approximately 450 nanometers of oxide consumes about 200 nanometers of the semiconductor substrate. Thus the oxidation consumes the silicon damaged by the implant step.

Upon completion of the wet oxidation (reference numeral 25), the furnace is ramped up to a temperature ranging between approximately 950° C. and approximately 1200° C. at a rate less than or equal to approximately 5° C. per minute (reference numeral 26). In the preferred embodiment, the furnace is raised to approximately 1100° C. in about 54 minutes and maintained at this temperature for at least 7 minutes, and preferably for about 10 minutes, to drive-in the dopants. Upon completion of the drive-in step, the furnace is ramped down (reference numeral 28) to a temperature ranging between approximately 600° C. and approximately 900° C. (reference numeral 29) at a rate of less than or equal to approximately 3° C. per minute. Preferably, the furnace is ramped down to approximately 750° C. in about 117 minutes and semiconductor substrate 30 is equilibrated at this temperature. This sequence of steps is collectively referred to as a drive-in step or a junction depth modulation step (reference numeral 27).

As those skilled in the art are aware, impurity materials or dopants are provided on a semiconductor substrate such as a silicon wafer and driven into the semiconductor substrate by placing the semiconductor substrate in a furnace and subjecting the semiconductor substrate to a series of temperature and atmospheric changes. Chart 20 of FIG. 2 illustrates a method of making the temperature and atmospheric changes in accordance with the present invention. It shall be understood that the affect of the pre-oxidation anneal step (reference numeral 23) on the junction depth is small compared to that of the drive-in step (reference numeral 27). Accordingly, the pre-oxidation anneal step (reference numeral 23) is predominantly a defect density reduction step. FIGS. 3–6 illustrate a semiconductor substrate 30 in various stages during the temperature and atmospheric changes (i.e., during the manufacturing process) in accordance with the method illustrated in chart 20 of FIG. 2.

Figure 3:
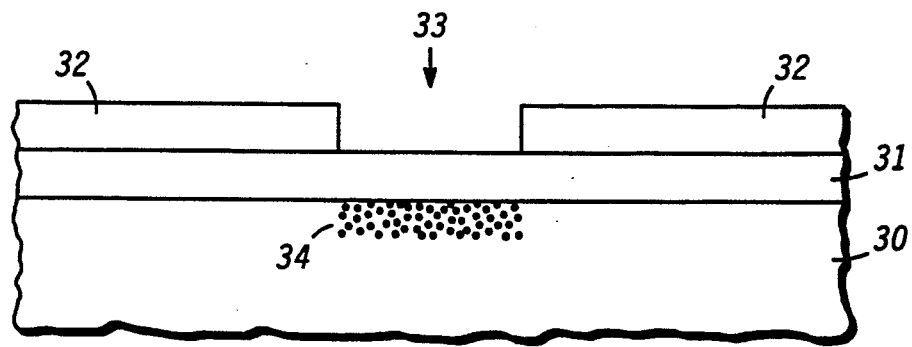
FIG. 3 illustrates a highly enlarged cross-sectional view of a semiconductor substrate in accordance with the present invention.

FIG. 3 illustrates a semiconductor substrate 30 having a layer of dielectric material 31 disposed thereon. Preferably layer of dielectric material 31 is an oxide layer, commonly referred to as a screen oxide, having a thickness of approximately 20 nanometers. Screen oxide 31 is covered with a patterned photoresist layer 32 having an opening 33 which exposes a portion of screen oxide 31 and through which dopant or impurity materials 34 are introduced into semiconductor substrate 30. Dopant 34 can be any suitable impurity material such as arsenic, antimony, phosphorus, boron, or the like. Dopant 34 may be introduced into semiconductor substrate 30 using ion implantation or diffusion techniques. Ion implantation and diffusion techniques are well known by those skilled in the art.

Figure 4:
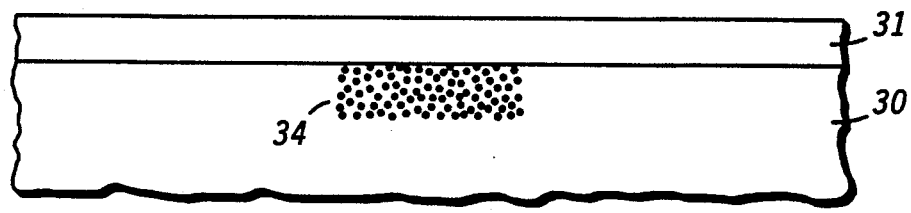
FIG. 4 illustrates a highly enlarged cross-sectional view of the semiconductor substrate of FIG. 3 after a pre-oxidation anneal step.

FIG. 4 illustrates the semiconductor substrate of FIG. 3 after the photoresist layer has been removed and after it has undergone the pre-oxidation anneal (reference numeral 23 of FIG. 2). During the pre-oxidation anneal, enough dopant 34 diffuses into semiconductor substrate 30 so as to preclude "pile-up" during the subsequent oxidation step. Dopant atoms "pile-up" at the silicon-oxide interface until their concentration exceeds their solid solubility limit. Once the solid solubility limit is exceeded, dopant precipitates form at the oxide-silicon interface which become surface defect sites following oxide stripping. These surface defects, in turn, generate defects in the epitaxial layer which prevent the proper functioning of integrated circuits within the semiconductor material, i.e., they lower the yield of the semiconductor integrated circuits. By using the pre-oxidation anneal, dopant 34 is distributed so that the solid solubility limit is not exceeded during the oxidation step (reference numeral 25 of FIG. 2).

Figure 5:
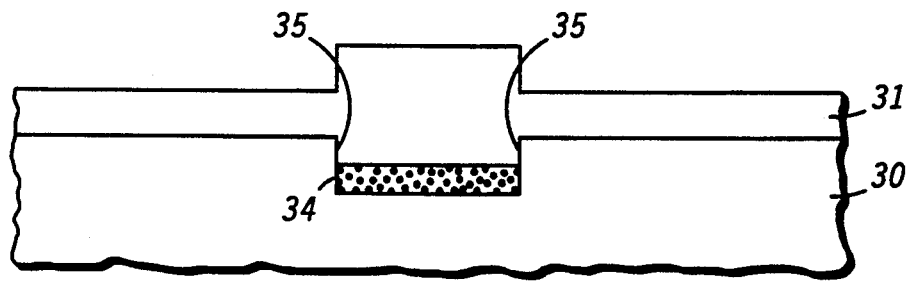
FIG. 5 illustrates a highly enlarged cross-sectional view of the semiconductor substrate of FIG. 4 after an oxidation step.

FIG. 5 illustrates the semiconductor wafer 30 after oxidation in accordance with the present invention (step 25 of FIG. 2). As those skilled in the art are well aware, the oxidation step increases the thickness of oxide layer 31. Accordingly, the same reference numeral. i.e., 31, is used to denote the oxide layer. A step 35 is illustrated in FIG. 5 which results from the accelerated growth of oxide layer 31 over dopant impurity 34 as opposed to the growth of the oxide over the lightly-doped silicon. For example, in the preferred embodiment of the present invention the ratio of the oxidation rate of the doped semiconductor substrate to the undoped semiconductor substrate is approximately 7 to 1. The different semiconductor substrate oxidation rates may be used for pattern delineation and alignment. The use of different oxidation rates to promote pattern delineation is well known in the art and may be found in U.S. Pat. No. 4,717,687 which issued to Verma on Jan. 5, 1988 and is entitled "Method for Providing Buried Layer Delineation," and which is hereby incorporated herein by reference. Thus, semiconductor substrate 30 is oxidized to a greater depth in the region having dopant 34 than in the region not having dopant 34.

Figure 6:
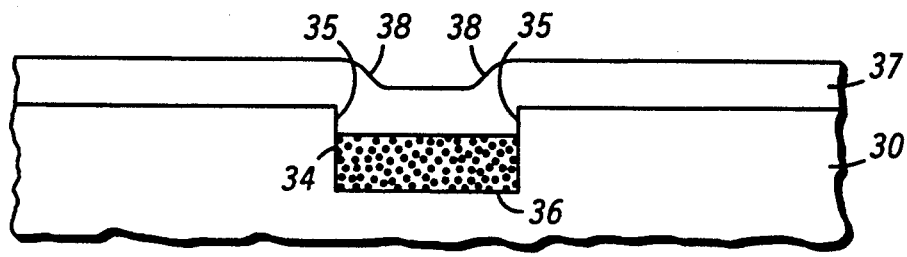
FIG. 6 illustrates a highly enlarged cross-sectional view of the semiconductor substrate of FIG. 5 after an epitaxial growth step.

FIG. 6 illustrates a junction depth of a buried layer 36 after the drive-in or anneal step (reference numeral 27 of FIG. 2). Dopant 34 is driven into semiconductor substrate 30 to a desired depth. For example, using a drive-in temperature of approximately 1100° C. and a time of about 10 minutes yields a junction depth of approximately 0.65 micrometers and a dopant surface concentration of approximately $2 \times 10^{20}$ atoms/cm$^3$. For comparison, the junction depth using the prior art process of FIG. 1 is approximately 1.05 micrometers for a dopant surface concentration of approximately $1.5 \times 10^{20}$ atoms/cm$^3$.

In addition, FIG. 6 illustrates the structure of FIG. 5 with oxide layer 31 removed and an epitaxial layer 37 grown over semiconductor substrate 30. Methods of removing oxide layers and growing epitaxial layers are well known to those skilled in the art. Since epitaxial layer 37 follows the contour of substrate 10, step 35 from FIG. 5 appears as step 38 in epitaxial layer 37. Step 38 provides pattern delineation which will be used in the subsequent processing of semiconductor substrate 30 for aligning other elements of an integrated circuit to buried layer 36.

By now it should be appreciated that there has been provided a method for decoupling or temporally spacing the step of decreasing the defect density of the epitaxial layer from the step of setting the junction depth (reference numeral 27) of buried layer 36. The defect density is reduced primarily through a pre-oxidation anneal which disperses the dopant so that precipitates of the dopant do not form during the subsequent oxidation step. After the oxidation step, a drive-in or anneal step is performed that drives the dopant to a desired depth into the substrate. Although the drive-in step is performed at a sufficiently high temperature to drive the dopant to the desired depth, it is performed at a sufficiently low temperature to allow lower ramp-up and ramp-down rates, thereby keeping the ramp-up and the ramp-down rates less than the slew rate of the furnace and making the drive-in step compatible with slip-free processing. The flexibility to use reduced ramp rates and drive temperature are a consequence of incorporating the pre-oxidation anneal, which decouples the junction depth setting anneal from the defect reduction step.

Further, the present invention allows formation of a shallower junction depth resulting in a reduced collector to substrate capacitance and a lower buried layer sheet resistance. The shallower buried layer junction depth reduces cycle time by allowing formation of shallower trenches in trench isolated processes. In other words, less time is required to form the trenches because they do not have to be etched as deeply.

In addition, lateral diffusion of the dopant atoms is decreased which allows the formation of smaller geometry devices relative to prior art processing techniques. For example, feature sizes on BICMOS processes using the prior art techniques of forming the buried layer were limited to a 0.6 μm design rule level because of lateral diffusion of the impurity material. However, feature sizes on BICMOS processes using the present invention to form buried layers can attain design rule levels of 0.5 μm as well as 0.4 μm.

We claim:

1. A method of temporally spacing a defect density modulation step and a junction depth modulation step, comprising the steps of:

doping a portion of a substrate with an impurity material of a first conductivity type;

modulating a defect density, wherein modulating the defect density includes heating the substrate to a temperature of at least 950° C.;

forming an oxide on the substrate wherein the oxide is formed at a temperature less than the temperature of heating the substrate during the defect density modulation step;

modulating a junction depth, wherein modulating the junction depth includes heating the substrate to a temperature greater than the temperature at which the oxide is formed;

removing the oxide; and forming an epitaxial layer over the substrate.

2. A method of temporally spacing a defect density modulation step and a junction depth modulation step as claimed in claim 1, wherein the step of modulating the defect density includes heating the substrate to at most 1100° C.

3. A method of temporally spacing a defect density modulation step and a junction depth modulation step as claimed in claim 1, wherein the step of modulating the junction depth includes heating the substrate to at least 950° C. wherein a temperature of the substrate is increased at a rate of less than or equal to about 5° C. per minute until the at least 950° C. temperature is achieved.

4. A method of temporally spacing a defect density reduction step and a junction depth modulation step as claimed in claim 1, wherein the step of modulating the defect density comprises:

increasing a temperature of the substrate to at least 950° C. at a rate less than or equal to about 5° C. per minute;

maintaining the substrate at the temperature of at least 950° C. for at least 10 minutes; and decreasing the temperature of the substrate to less than 900° C. at a rate of less than or equal to about 3° C. per minute.

5. A method of temporally spacing a defect density modulation step and a junction depth modulation step as claimed in claim 1, further including forming the oxide at a temperature less than 900° C.

6. A method of temporally spacing a defect density modulation step and a junction depth modulation step as claimed in claim 1, wherein the step of modulating the junction depth comprises:

increasing the temperature of the substrate to the temperature greater than the temperature at which the oxide is formed at a rate less than or equal to about 5° C. per minute;

maintaining the substrate at the temperature greater than the temperature at which the oxide is formed for at least 7 minutes; and decreasing the temperature of the substrate to less than 900° C. at a rate of less than or equal to about 3° C. per minute.

7. A method of temporally spacing a defect density modulation step and a junction depth modulation step as claimed in claim 1, wherein the step of modulating the junction depth includes heating the substrate to a temperature ranging between 950° C. and 1200° C.

8. A method of doping a semiconductor substrate capable of reducing a defect density and independently setting a junction depth, comprising the steps of:

providing a semiconductor impurity material of a first conductivity type to the semiconductor substrate;

heating the semiconductor substrate to a temperature of at least 950° C.;

reducing the temperature of the semiconductor substrate, wherein the semiconductor substrate is in an oxidizing ambient atmosphere at a temperature ranging between 825° C. and 900° C.;

heating the semiconductor substrate to a temperature ranging between 950° C. and 1200° C.; and reducing the temperature of the semiconductor substrate to a temperature ranging between 600° C. and 900° C.

9. A method of doping a semiconductor substrate as claimed in claim 8, further including providing silicon as the semiconductor substrate.

10. A method of doping a semiconductor substrate as claimed in claim 8, further including using steam as the oxidizing ambient atmosphere.

11. A method of doping a semiconductor substrate as claimed in claim 8, wherein the step of heating the semiconductor substrate to a temperature of at least 950° C. and the step of heating the semiconductor substrate to a temperature ranging between 950° C. and 1200° C. includes ramping the temperature up to said temperatures at a rate of less than or equal to about 5° C. per minute and ramping the temperature down from said temperatures at a rate less than or equal to about 3° C. per minute.

12. A method of providing a buried layer having separate steps for decreasing a defect density of an epitaxial layer and setting a junction depth, comprising the steps of:

providing a semiconductor substrate having a layer of dielectric material disposed thereon;

patterning a layer of photoresist on the layer of dielectric material, the patterned layer of photoresist having at least one opening exposing a portion of the layer of dielectric material;

implanting a dopant of a first conductivity type through the at least one opening, through the exposed portion of the layer of dielectric material, and into the semiconductor substrate;

removing the patterned layer of photoresist;

equilibrating the semiconductor substrate at a first temperature;

performing a pre-oxidation anneal of the semiconductor substrate, the pre-oxidation anneal at a second temperature, wherein the second temperature is greater than the first temperature;

oxidizing the semiconductor substrate at a third temperature, wherein the third temperature is less than the second temperature;

driving-in the dopant, wherein the step of driving-in the dopant sets the junction depth and is performed at a fourth temperature, the fourth temperature being greater than the third temperature; and equilibrating the semiconductor substrate at a fifth temperature.

13. A method of providing a buried layer as claimed in claim 12, wherein the step of performing the pre-oxidation anneal of the semiconductor substrate comprises:

ramping up the temperature of the semiconductor substrate to the second temperature in about 50 minutes;

heating the semiconductor substrate at the second temperature for 15 minutes; and ramping down the temperature of the semiconductor substrate to the third temperature in about 57 minutes.

14. A method of providing a buried layer as claimed in claim 12, further including setting the first temperature between 600° C. and 900° C., the second temperature between 950° C. and 1100° C., the third temperature between 825° C. and 900° C., the fourth temperature between 950° C. and 1200° C., and the fifth temperature between 600° C. and 900° C.

15. A method of providing a buried layer as claimed in claim 12, wherein the step of driving-in the dopant includes ramping up the temperature of the semiconductor substrate to the fourth temperature at a rate of about 5° C. per minute, maintaining the semiconductor substrate at the fourth temperature for a desired time, and ramping down the temperature of the semiconductor substrate to the fifth temperature at a rate of about 3° C. per minute.

16. A method of providing a buried layer as claimed in claim 15, further including ramping up the temperature of the semiconductor substrate from the third temperature to the fourth temperature in about 54 minutes, wherein the third temperature is 830° C. and the fourth temperature is 1100° C. and ramping down the temperature of the semiconductor substrate to the fifth temperature in about 117 minutes, wherein the fifth temperature is 750° C.

17. A method of providing a buried layer as claimed in claim 12, including selecting the dopant of the first conductivity type from the group consisting of arsenic and antimony.

18. A method of providing a buried layer as claimed in claim 12, including selecting the dopant of the first conductivity type such that the semiconductor substrate is differentially oxidized.

19. A method of providing a buried layer as claimed in claim 12, including providing silicon as the semiconductor substrate.

* * * * *